United States Patent
Balluchi et al.

(10) Patent No.: US 12,154,655 B2
(45) Date of Patent: *Nov. 26, 2024

(54) ADJUSTABLE MEMORY CELL RELIABILITY MANAGEMENT

(71) Applicant: Micron Technology, Inc., Boise, ID (US)

(72) Inventors: Daniele Balluchi, Cernusco sul Naviglio (IT); Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 39 days.

This patent is subject to a terminal disclaimer.

(21) Appl. No.: 17/861,231

(22) Filed: Jul. 10, 2022

(65) Prior Publication Data

US 2024/0013822 A1 Jan. 11, 2024

(51) Int. Cl.
*G11C 11/22* (2006.01)
*G06F 11/07* (2006.01)
*G11C 7/10* (2006.01)
*G11C 7/12* (2006.01)

(52) U.S. Cl.
CPC .............. *G11C 7/12* (2013.01); *G06F 11/073* (2013.01); *G06F 11/0793* (2013.01); *G11C 7/1069* (2013.01)

(58) Field of Classification Search
CPC ....... G11C 7/12; G11C 7/1069; G06F 11/073; G06F 11/0793
See application file for complete search history.

(56) References Cited

U.S. PATENT DOCUMENTS

| | | |
|---|---|---|
| 8,438,452 B2 | 5/2013 | Agarwal et al. |
| 8,910,280 B2 | 12/2014 | Karasaridis |
| 9,213,609 B2 | 12/2015 | Hansen et al. |
| 10,445,236 B2 | 10/2019 | Boyle |
| 11,295,797 B1 * | 4/2022 | Visconti .............. G11C 11/2275 |
| 2003/0126409 A1 | 7/2003 | Juan et al. |
| 2003/0151968 A1 * | 8/2003 | Johnson ............... G11C 7/1045 365/230.03 |
| 2014/0006879 A1 | 1/2014 | Rangarajan |
| 2017/0068537 A1 | 3/2017 | Ramanujan |
| 2019/0189187 A1 * | 6/2019 | Hush ........................ G11C 8/10 |
| 2021/0020220 A1 * | 1/2021 | Di Vincenzo ....... G11C 11/2257 |
| 2023/0016520 A1 * | 1/2023 | Sforzin ............ G11C 29/50008 |

* cited by examiner

*Primary Examiner* — Min Huang
(74) *Attorney, Agent, or Firm* — Brooks, Cameron & Huebsch, PLLC (57) ABSTRACT

Systems, apparatuses, and methods related to a flip-on-precharge disable operation are described herein. In an example, a method can include receiving a command to perform a precharge operation on a set of memory cells in a memory device. The memory device can include a plurality of sets of memory cells corresponding to respective portions of an array of memory cells of the memory device. The method can further include accessing one or more sets of bits in a mode register. The one or more sets of bits in the mode register indicate address locations of the plurality of sets of memory cells to disable the flip on precharge operation. The method can further include performing the precharge operation on the set of memory cells. The flip on precharge operation associated with the precharge operation can be disabled for those sets of the plurality of sets of memory cells whose address locations are in the mode register.

20 Claims, 7 Drawing Sheets

ADJUSTABLE MEMORY CELL RELIABILITY MANAGEMENT

TECHNICAL FIELD

The present disclosure relates generally to apparatuses, systems, and methods for adjustable memory cell reliability management.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices can be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Systems, apparatuses, and methods related to adjustable memory cell reliability management via disabling of a flip on precharge operation for at least one address location are described herein. Memory cells of a memory device can be programmed to a target (e.g., desired) data state. For instance, an electric charge can be placed on or removed from a charge storage structure (e.g., a floating gate or a replacement gate) of a memory cell in a page to program the memory cell to a particular data state (e.g., store data). In order to increase device reliability, a data pattern of a row of data stored in the memory device can be flipped during a precharge operation (e.g., the data pattern can be reversed or made the opposite, such as each "0" can be changed to a "1" and each "1" can be changed to a "0"). This flipping can be referred to as a flip on precharge (FOP) operation. In doing so, an imprint made by the data stored in the memory cells can be counteracted. An imprint can refer to an effect caused by a same data value being stored in a memory cell for a particular period of time or the same data value being stored to the memory cell over and over, causing an imprint of that data value in the memory cell. Further, an enhanced imprint-and-fatigue phenomena can be counteracted.

While performing a flip on a data pattern during a precharge operation can counteract imprint issues, the state of the data of the memory cells (whether flipped or non-flipped) can become an issue when performing an error correction operation. The error correction operation can be used to detect errors in data stored in the memory cells and determine whether to recover data, replace data stored in memory pages whose memory cells are no longer reliable, and/or perform additional memory error correction remedies. As an example, an error correction operation can perform a number of checks by writing and reading different patterns (e.g., all0, all1, check-boards) to check an entire row of cells, an entire column of cells, etc., to detect errors in the data stored in the memory cells and/or to determine if a memory cell is malfunctioning or has been worn out by use. If a row or column is determined to be in error, a check of adjacent rows and/or columns can be performed. An "all0" pattern can refer to writing a "0" to all or a particular portion of memory cells and an "all1" pattern can refer to writing a "1" to all or a particular portion of memory cells. A check-board pattern can refer to a pattern that resembles a chess board and can be indicated by the following matrix of bits:

010101
101010
010101
101010

However, a determination of whether the data stored in the memory cells have been flipped can complicate the error correction process. By providing an ability to disable the FOP operation when performing such error correction operations, the error correction operations can be simplified and increase accuracy of the results. Further, it may be easier to detect a "stuck-at-1" or "stuck-at-0" memory cell (e.g., a memory cell that is in error such that a logical value of "1" or a logical value of "0," respectively, cannot be overwritten) when disabling the FOP operation.

Further, targeting which portions of memory cells are prevented from having a flip on precharge operation performed can be beneficial. For example, a particular portion of memory cells may need to have error correction performed without it being necessary to perform error correction on other portions of memory cells. In this case, the flip on precharge (FOP) operation can be disabled from being performed on the portion of memory cells but still performed on the other sections of memory cells. In order to do this, a mode register can store address locations of memory cells where the FOP operation should be disabled. In this way, the mode registers can be accessed and the address locations for disablement can be determined and the FOP operation can proceed for memory cells whose associated address locations are not stored in the mode registers. The portion of address locations can be adjusted based on which memory cells are about to have error correction performed or for other reasons where a FoP operation may not be desired for that particular portion of memory cells.

Memory cell activation can be performed prior to a precharge operation. In the process of memory cell activation timing, an activation operation can be performed on a memory cell to open the memory cell for reading. Subsequent to activation, a read operation can be performed on the memory cell. Subsequent to activation and/or reading, the precharge operation can be performed on the memory cell in order to close the memory cell. The FOP operation can be performed in conjunction with the precharge operation.

Figure 1:
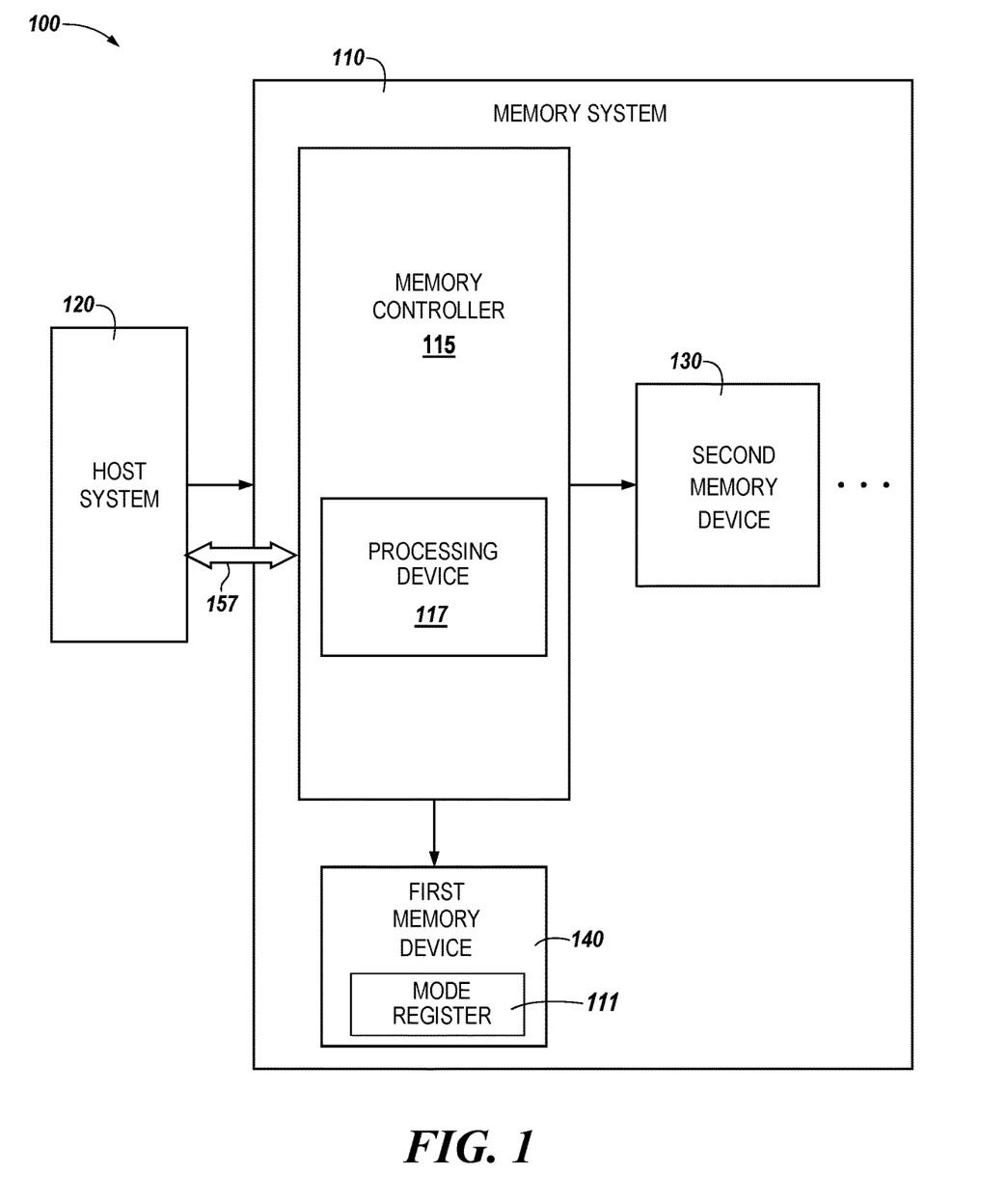
FIG. 1 illustrates an example computing system that includes a memory system in accordance with a number of embodiments of the present disclosure.

The memory cells are part of a memory system (such as memory system 110 in FIG. 1). In some embodiments, the memory system can be a Compute Express Link (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface. In some embodiments, the CXL technology can include a plurality of I/O lanes configured to transfer the plurality of commands and data to or from circuitry external to the memory controller at a rate of around thirty-two (32) giga-transfers per second. In another embodiments, the CXL technology can comprise a peripheral component interconnect express (PCIe) 5.0 interface coupled to a plurality of I/O lanes, wherein the memory controller is to receive commands involving at least one of a memory device, a second memory device, or any combination thereof, via the PCIe 5.0 interface according to a compute express link memory system.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

As used herein, a "set of memory cells" or "set" refers to a physical arrangement of memory cells such as a row of memory cells or a portion of a row of memory cells, among other possible configurations of memory cells. As used herein, a "row of memory cells" or "row" refers to an arrangement of memory cells that can be activated together (e.g., via access lines). Each row can include a number of pages. As used herein, the term "page" and "pages of memory cells" can be interchangeably used. As used herein, a "page" refers to a unit of programming and/or sensing (e.g., a number of memory cells that are programmed and/or sensed together as a functional group). In some embodiments each row (or a subset of a row) can comprises one page of memory cells.

As used herein, designators such as "M," "R," "J," "S," "U," etc., for example, particularly with respect to reference numerals in the drawings, indicate that a number of the particular feature can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of sound devices) can refer to one or more sound devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the figure. Similar elements or components between different figures can be identified by the use of similar digits. A group or plurality of similar elements or components can generally be referred to herein with a single element number. For example, a plurality of reference elements 203-0, . . . 203-M (e.g., 203-0 to 203-M) can be referred to generally as 203. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 illustrates an example computing system 100 that includes a memory system 110 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In some embodiments, the computing system 100 can include a memory system 110 including a memory controller 115 and memory devices 130, 140. The computing system 100 can be coupled to a host system 120.

In some embodiments, the memory controller 115 can be configured to manage a DRAM memory device. The memory devices 130, 140 can provide main memory for the computing system 100 or could be used as additional memory or storage throughout the computing system 100. In some embodiments, the memory devices 130, 140 can be a ferroelectric field-effect transistor (FeFET) memory device. In another embodiment, the memory devices 130, 140 can be a dynamic random-access memory (DRAM), ferroelectric random-access memory (FeRAM), or a resistive random-access memory (ReRAM) device, or any combination thereof. The memory devices 130, 140 can include one or more arrays of memory cells, e.g., volatile and/or non-volatile memory cells. In various embodiments, the memory devices 130, 140 can include at least one array of volatile memory cells. Embodiments are not limited to a particular type of memory device. For instance, the memory devices can include RAM, ROM, DRAM, SDRAM, PCRAM, RRAM, and flash memory, among others. Although shown as two memory devices 130, 140, it will be appreciated that a single memory device or three or more memory devices, are contemplated within the scope of the disclosure.

As described herein, the memory device 140 (and in some embodiments the memory device 130, although not illustrated) includes a mode register 111 that stores address locations of memory cells. The address locations can correspond to memory cells that should not have a flip on precharge operation performed. For instance, it may be beneficial to avoid a flip on precharge operation on only a portion of memory cells while still performing a flip on precharge on other portions of memory cells.

A memory system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory systems 110. In some embodiments, the host system 120 is coupled to different types of memory system 110. The host system 120 can include a processor chipset and a software stack executed by the processor chipset. The processor chipset can include one or more cores, one or more caches, a memory controller (e.g., a DRAM memory controller, a dynamic memory controller, etc.), and a storage protocol controller (e.g., PCIe controller, SATA controller). The host system 120 uses the memory system 110, for example, to perform a command. As used herein, the term "command" refers to an instruction from a memory system to perform a task or function. For example, the memory controller 115 of the memory system 110 can cause a processing device 117 to perform a task based on a given command. In some embodiment, a command can include a memory request. That is, a command can be a request to read and/or write data from and/or to the memory device (e.g., second memory device 130 and/or first memory device 140). The host system 120 may, for example, write data to the memory system 110 and read data from the memory system 110 based on a command (e.g., memory request).

The host system 120 can be coupled to the memory system 110 via a physical host interface. Examples of a physical host interface include, but are not limited to, a serial advanced technology attachment (SATA) interface, a peripheral component interconnect express (PCIe) interface, Compute Express Link (CXL) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory system 110. The host system 120 can further utilize an NVM Express (NVMe) interface to access components (e.g., memory devices 130, 140) when the memory system 110 is coupled with the host system 120 by the PCIe interface. The physical host interface can provide an interface for passing control, address, data, and other signals between the memory system 110 and the host system 120. In general, the host system 120 can access multiple memory systems via a same communication connection, multiple separate communication connections, and/or a combination of communication connections.

In various embodiments, the memory controller 115 may generate status information, which may be transferred to or from host system 120, for example via the sideband channel 157. The sideband channel 157 may be independent of (e.g., separate from) a double data rate (DDR) memory interface and/or a non-volatile memory express (NVMe) interface that may be used to transfer (e.g., pass) DDR commands and/or NVM commands between the host system 120 and the memory device 110. That is, in some embodiments, the sideband channel 157 may be used to transfer commands to cause performance of bit vector operations from the host system 120 to the memory device 110 while a control bus (not illustrated) is used to transfer DRAM commands and/or NVM commands from the host system 120 to the memory device 110. The memory devices 130, 140 can include any combination of the different types of non-volatile memory devices and/or volatile memory devices. Examples of volatile memory devices can be, but are not limited to, random access memory (RAM), such as dynamic random-access memory (DRAM) and synchronous dynamic random-access memory (SDRAM).

Some examples of non-volatile memory devices can include, but are not limited to, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130, 140 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130, 140 can be grouped as pages that can refer to a logical unit of the memory device used to store data. In some embodiments, pages of memory cells can be comprised of one or more rows of memory cells. In addition, a row of memory cells can be comprised of one or more sets of memory cells.

The memory controller 115 (or controller 115 for simplicity) can communicate with the memory devices 130, 140 to perform operations such as reading data, writing data, or erasing data at the memory devices 130, 140 and other such operations. The memory controller 115 can include hardware such as one or more integrated circuits and/or discrete components, a buffer memory, or a combination thereof. The hardware can include digital circuitry with dedicated (i.e., hard-coded) logic to perform the operations described herein. The memory controller 115 can be a microcontroller, special purpose logic circuitry (e.g., a field programmable gate array (FPGA), an application specific integrated circuit (ASIC), etc.), or other suitable processor.

While the example memory system 110 has been illustrated in FIG. 1 as including the memory controller 115, in another embodiment of the present disclosure, a memory system 110 does not include a memory controller 115, and can instead rely upon external control (e.g., provided by an external host, or by a processor or controller separate from the memory system).

In general, the memory controller 115 can receive commands or operations from the host system 120 and can convert the commands or operations into instructions or appropriate commands to achieve the desired access to the memory device 130 and/or the memory device 140. The memory controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address (PBA), physical media locations, etc.) that are associated with the memory devices 130, 140. The memory controller 115 can further include host interface circuitry to communicate with the host system 120 via the physical host interface. The host interface circuitry can convert the commands received from the host system into command instructions to access the second memory device 130 and/or the first memory device 140 as well as convert responses associated with the second memory device 130 and/or the first memory device 140 into information for the host system 120.

The memory system 110 can also include additional circuitry or components that are not illustrated. In some embodiments, the memory system 110 can include a cache or buffer (e.g., DRAM) and address circuitry (e.g., a row decoder and a column decoder) that can receive an address from the memory controller 115 and decode the address to access the second memory device 130 and/or the first memory device 140.

As discussed herein, the memory system 110 (and/or constituent components thereof, such as memory cells of the first memory device 140 and/or memory cells of the second memory device 130, etc.) can experience charge leakage and/or parasitic currents due to repeated access of a set of memory cells. In some instances, charge leakage and/or parasitic currents can cause data corruption in a page associated with the set of memory cells and/or cause the page associated with the set of memory cells to wear-out. In some embodiments, the memory controller 115 can detect and mitigate errors in data due to charge leakage and/or parasitic currents using an error detection operation. The memory system 110 can also cause a flipping of one or more bits associated with data when performing a precharge operation in order to increase the reliability of the memory system 110. However, flipping of the data (during a FOP operation) can complicate or prevent the detection of memory cells that are no longer reliable. To increase reliability and efficiency of detection of the memory cells that are no longer reliable, the memory controller 115 can cause a disabling of the FOP operation in certain circumstances, (e.g., during performance of maintenance operations), among other scenarios.

For example, in some embodiments, the memory controller 115 can receive a first command (e.g., signaling indicative of performance of a memory access request) associated with a set of memory cells in a memory device (e.g., the second memory device 130 and/or the first memory device 140) including a plurality of sets of memory cells corresponding to respective portions of an array of memory cells of the memory. The command can be associated with a request to read data (e.g., read request) from the memory system 110 or a request to write data (e.g., write request) to the memory system 110. The memory controller 115 can activate the set of memory cells to perform a memory access of the memory responsive to the command. For example, the memory controller 115 can cause the set of memory cells to activate to write data to a memory device. Similarly, the memory controller 115 can cause the set of memory cells to activate to read data stored on a memory device. As used herein, the term "activate" refers to the act of opening a row, set, and/or page to permit a read and/or write of data to the row, set, and/or the page once opened. For example, one or more row access commands can be asserted on a row, set, and/or page of memory cells to cause data (e.g., charges) stored by the memory cells to be read by circuitry associated with the memory device.

The memory controller 115 can receive a second command associated with a set of memory cells. The second and/or subsequent command can cause activation of the same set of memory cells (e.g., the same set of memory cells as those associated with a first command) to perform a memory access responsive to the second command and/or the subsequent command. Prior to performing a memory access responsive to the second command (i.e., a second memory access), the memory controller 115 can precharge a set of memory cells. In some embodiments, the memory controller 115 can precharge the set of memory cells to deactivate the set of memory cells after the memory access has been performed responsive to the first command. As used herein, the term "precharge" refers to the act of applying a voltage to bit lines (e.g., digit lines) coupled to the memory cells to close an open set, row, and/or page to put the set, row, and/or page in an idle state. In some examples, such as when operations not related to detection of memory cells that are no longer reliable are performed, a flip-on-precharge (FOP) operation can be performed in order to increase the reliability of the set of memory cells (e.g., by storing different data values at each access/read/precharge cycle). In some examples, when operations related to detection of memory cells that are no longer reliable are performed, the FOP operation can be disabled in order to perform the detection efficiently and reliably.

The memory controller 115 can activate the set of memory cells to perform a second memory access responsive to the second command after the precharge operation (with or without the FOP operation being performed, depending on the type of memory operation being performed). In some embodiments, the memory controller 115 can perform the second memory access by applying a sensing voltage to the memory cells of the set of memory cells. For instance, the memory controller 115 can activate the set of memory cells to read data from the memory device 130 (e.g., read request) or a request to write data to the memory device 130 (e.g., write request), resulting in the application of a sensing voltage to the set of memory cells. In the examples where a memory operation not related to detection of memory cells that are no longer reliable is performed, one or more bits (e.g., a data unit) used to indicate whether the data has been flipped or not, can be accessed and used to determine whether to use the actual data value stored or flip the stored data value in order to be used by the memory system 110. In the examples where a memory operation related to detection of memory cells that are no longer reliable is performed, one or more bits (e.g., a data unit) stored within the command to perform the precharge operation can indicate to disable the FOP operation.

Further, as is described in association with embodiments herein, an FOP operation can be disabled for a portion of memory cells. The address locations (e.g., LBA and/or PBA information corresponding to the address locations) of the portion of memory cells to be disabled from the FOP operation can be configured in mode registers 111 of a first memory device 140 and accessed in order to determine which memory cells to not perform the FOP operation. Further, when determining the actual data value for those memory cells whether the stored data value has been flipped can be taken into account.

Figure 2:
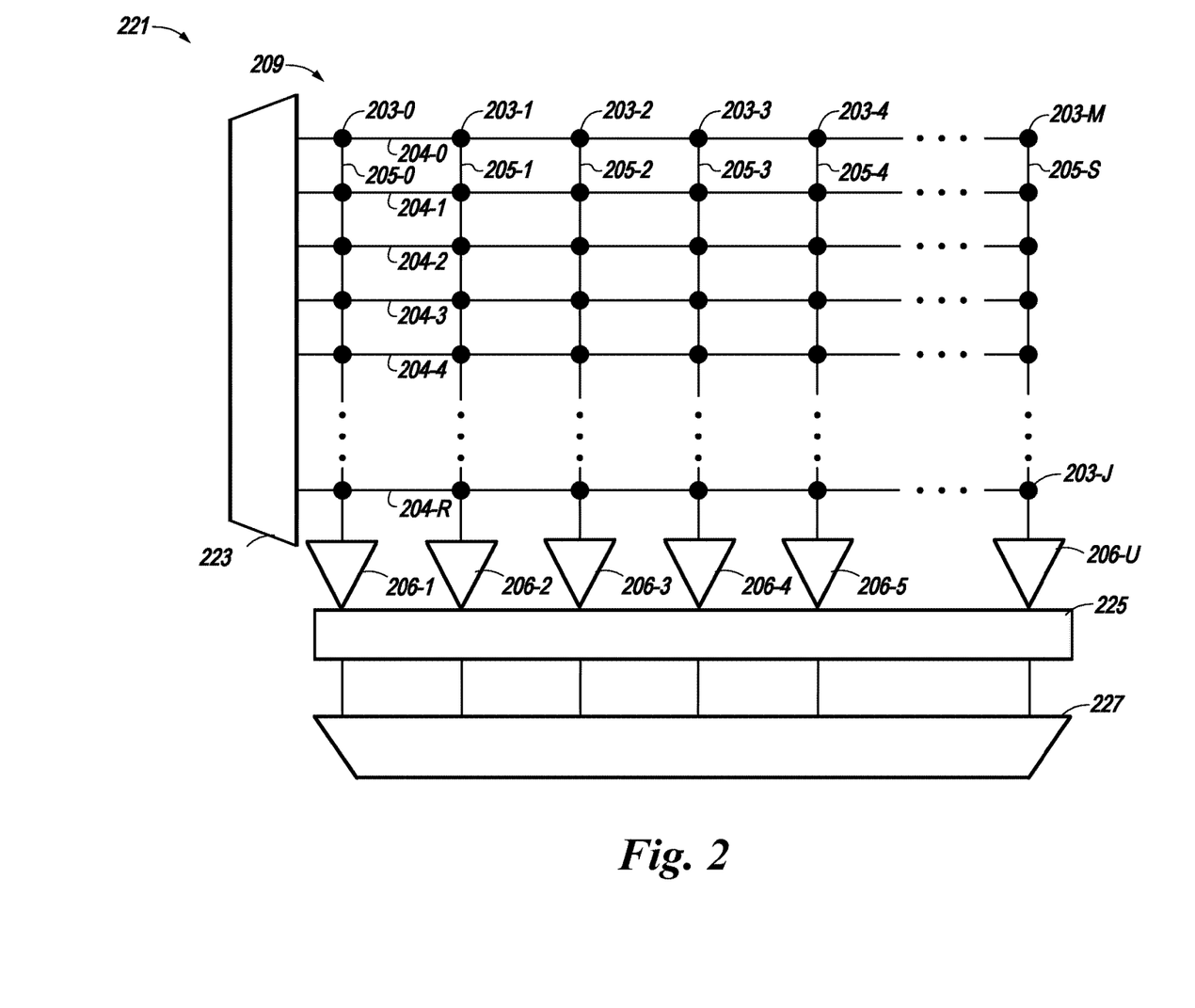
FIG. 2 illustrates an example functional diagram that includes memory cells arranged in rows in accordance with a number of embodiments of the present disclosure.

FIG. 2 illustrates an example functional diagram 221 that includes memory cells arranged in rows in accordance with a number of embodiments of the present disclosure. The functional diagram 221 can be used in connection with the computer system (e.g., the computer system 100 of FIG. 1). The functional diagram 221 can be within a number of memory devices (e.g., the memory devices 130, 140 in FIG. 1). The functional diagram can include an array 209 of memory cells 203-0 to 203-M, a row decoder 223, a row buffer 225, a plurality of sense amplifiers 206-1 to 206-U, and a multiplexer 227.

The array 209 includes memory cells (referred to generally as memory cells 203, and more specifically as 203-0 to 203-J) coupled to rows of access lines 204-0, 204-1, 204-2, 204-3, 204-4, 204-5, 204-6, . . . , 204-R (referred to generally as access lines 204) and columns of sense lines 205-0, 205-1, 205-2, 205-3, 205-4, 205-5, 205-6, 205-7, . . . , 205-S (referred to generally as sense lines 205). Further, the array 209 of memory cells is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines.

Each column of memory cells can be coupled to a number of respective sense amplifiers 206-1, 206-2, 206-3, 206-4, 206-5, 206-6, 206-7, . . . , 206-U coupled to the respective sense lines 205-0, 205-1, 205-2, 205-3, 205-4, 205-5, 205-6, 205-7, . . . , 205-S. Each of the respective sense amplifiers 206 are coupled to a row buffer 225 used to store the data accessed from the memory cells 203. As an example, the memory cells 203 can be selectively activated through decode lines to transfer data sensed by respective sense amplifiers 206-0 to 206-U to the row buffer 225.

In some embodiments, a memory controller (such as the memory controller 115 in FIG. 1) can send a first command and initiate a first activation on a first row of cells coupled to access line 204-0). The activation of the first row of cells can initiate a memory access of one or more memory devices. As used herein, activation of a row can include activation of all the rows or an activation of a subset of the rows. For instance, activation of a row can include activating all transistors of each cell 203-0, 203-1, 203-2, 203-3, 203-4, . . . , 203-M in a row or can include activating some but not all transistors on a row (a subset of cells 203-0 to 203-M). Activation of a row (or similarly activation of a subset of a row) can permit information to be stored on or accessed from the row.

In some embodiments, as illustrated in FIG. 2, a multiplexer 227 can be used to select particular data in the row buffer 225 that corresponds to a column of cells. As an example, a row address can be input to the row decoder 223 to indicate which row to access and a column address can be input to the multiplexer 227 to indicate which data associated with a column in the row buffer 225 to select so that particular data from a particular cell can be selected. The selected data can be transferred out of the multiplexer 227.

For example, the memory controller can alter the logic state (e.g., switch the logic state from a "1" to a "0"). However, as used herein logic states are not limited to "1" or "0" and can include other values/types of logic states.

Figure 3:
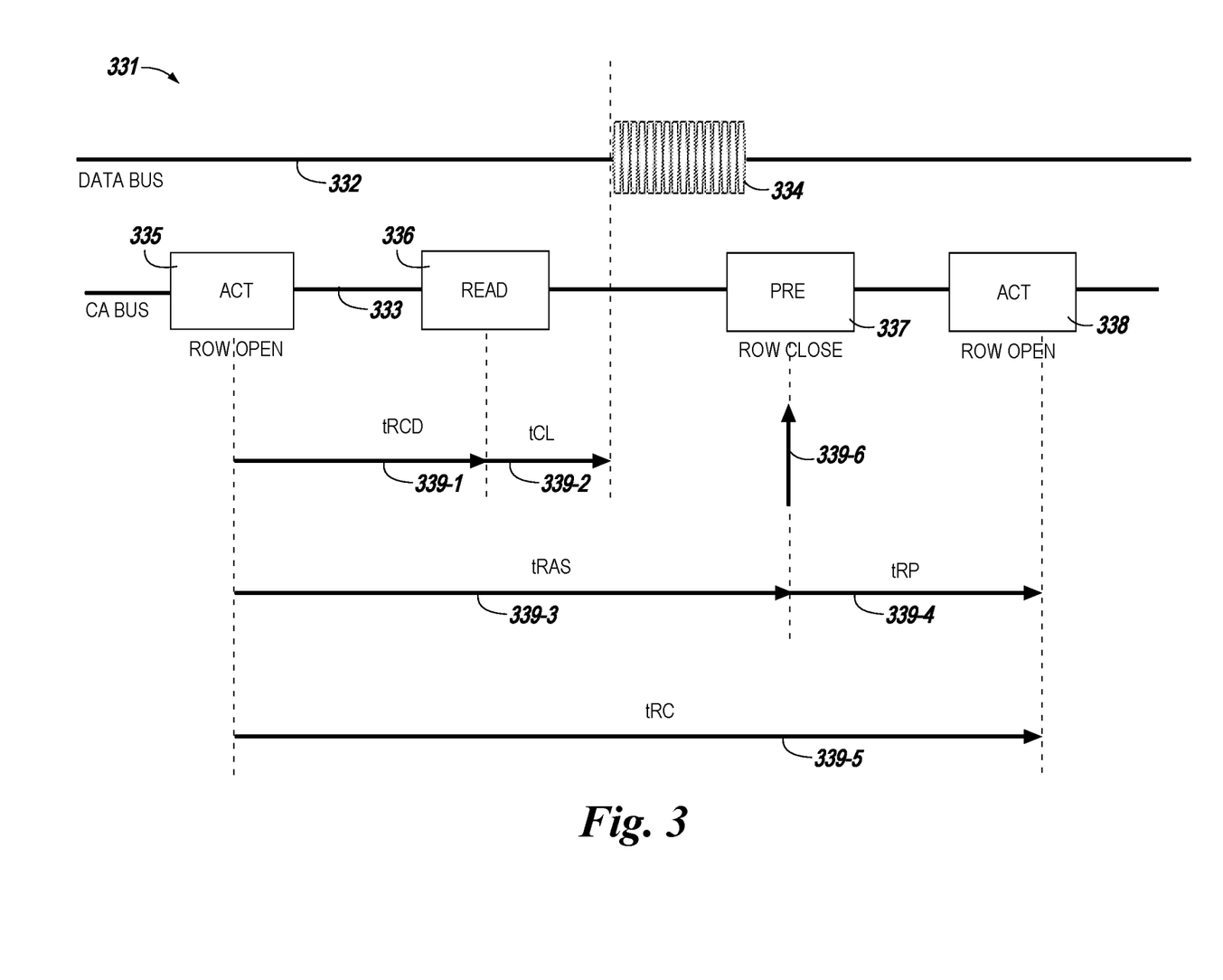
FIG. 3 is an example functional block timing diagram for performing memory operations in accordance with a number of embodiments of the present disclosure.

FIG. 3 is an example functional block timing diagram 331 for performing memory operations in accordance with a number of embodiments of the present disclosure. The timing diagram 331 illustrates a data bus (e.g., a DQ bus) 332 and a command/address ("CA") bus 333 at particular time periods when performing an activation ("ACT") 335 of a set of memory cells (which opens the set or row of memory cells), a read operation ("READ") 336, a precharge operation ("PRE") 337 (which closes the row of memory cells), and an additional activation ("ACT") 338. A first time period 339-1 between the activation 335 and the read operation 336 is referred to as the activation latency, which includes the time to perform activation and sense amplification within the sense amplifiers ("tRCD"). A second period of time 339-2 can be a period of time to access a column and can be referred to as "tCL." tCL stands for the time of CAS latency and is the number of cycles it takes to read a first bit of memory the memory system with a row already open. The first time period 339-1 can be referred to as the "tRCD," which refers to the minimum number of clock cycles used to open a row of memory cells and access a column. The data transfer 334 occurs subsequent to the second time period 339-2. The data transfer 334 can occur over approximately 8 ns. The data transfer 334 can be referred to as a tCCD (referring to a minimum column to column command delay due to a burst I/O gating) and can be a burst length per second (BL/s). As an example, the BL can equal 16 or 32 and speed in seconds can be a speed of the I/O bus. Further, as an example, if the speed is equal to 4 gigatranfers (GT)/second) and the BL=32, the tCCD=32 T/4 GT/s=8 ns.

In some embodiments, a third time period 339-3 can refer to the period of time between an activation 335 and a precharge operation 337 ("ROW CLOSE"). The third time period 339-3 can be referred to as the restoration latency, which includes the activation 335, the sense amplification, and restoration of the memory cells. This restoration latency can be referred to as "tRAS" and refers to the minimum number of cycles used between a row active command and issuing a precharge command. The third time period 339-3, in some examples, can be approximately 42 ns. A fourth time period 339-4 can be the time between a precharge operation 337 and an additional activation ("ROW OPEN") 338 of another row or set of memory cells. The fourth time period 339-4 can be referred to as a precharge latency and includes the latency between the precharge operation 337 and a subsequent activation 338. The total time period 339-5 to perform these operations can be referred to as "tRC," which refers to a row cycle time and is the minimum number of cycles a memory row takes to complete a full cycle. As an example, the tRC for an emerging memory can be 60 ns, tRC can be around 60 ns for LPDDR5, and tRC can be around 46 ns for DDR5.

As is described above, in some embodiments, a flip on precharge operation can be randomly performed prior to or subsequently with a precharge operation 337 in order to change what is stored in the memory cells at random intervals to increase reliability of the memory cells. The random flip on precharge (FOP) can occur at the precharge operation point, as illustrated by arrow 339-6, and one or more bits (e.g., a data unit) can be stored in the memory system in order to track which portions of data have been flipped. As the data is read out from the memory system, the one or more bits (e.g., data unit) indicating whether the data has been flipped can be accessed and the data can either be left as is (in response to the data unit indicating the data was not flipped) or flipped (in response to the data unit indicating the data was flipped). In this way, the host or user can receive the proper data and the flip on precharge operation can ensure that the data is more reliable while stored in the memory system.

However, when performing operations related to detection of memory cells that are no longer reliable, operations that check a number of different patterns stored in the memory cells can be complicated when random flip on precharge operations are occurring when performing precharge operations. For example, a number of activations and precharge operations can be performed during the detection of memory cells that are no longer reliable and if an operation is attempting to store all 0s, all 1s or a combination of both in a particular pattern, the flipping of those bits or patterns may provide an error when checked with what should be stored in those memory cells. In this way, the precharge command will include a data unit that indicates to not perform the random FOP operation and the detection of memory cells no longer reliable can be performed without false errors detected.

Figure 4:
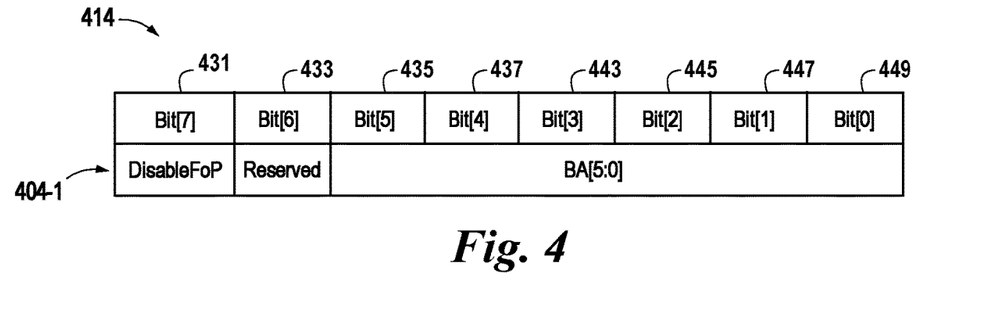
FIG. 4 is an example portion of a mode register of a memory device associated with bank addresses in accordance with a number of embodiments of the present disclosure.

FIG. 4 is an example portion of a mode register 414 of a memory device associated with bank addresses in accordance with a number of embodiments of the present disclosure. The portion of the mode register 414 can include a row of flip-flops 404-1 for storing a number of bits of data. As is illustrated, eight bits (seventh bit ("Bit[7]") 431 through zeroth bit ("Bit[0]") 449) are stored in the mode register 414, however embodiments aren't so limited and are used herein for explanatory purposes only. A seventh bit 431 can be used to indicate whether to disable a flip on precharge (FoP) operation (e.g., "DisableFoP"). The seventh bit 431, or DisableFoP bit, may be set when a flip on precharge operation is performed, indicating that a portion of the memory cells can be disabled from being flipped, as is described herein. A sixth bit (e.g., "Bit[6]") 433 can be reserved for future use in other operations. A fifth 435 through zeroth 449 bit can be for storing a bank address. As six bits are being used for addressing which bank is being targeted, sixty-four (64) banks can be addressed. However, embodiments are not so limited. For example, in some embodiments, thirty-two (32) banks can be used and therefore one less bit may be utilized. Further, other quantities of banks not mentioned may be used. The mode register 414 can be used to indicate which banks to locate the portions of memory cells where a flip on precharge operation should be disabled.

Figure 5A:
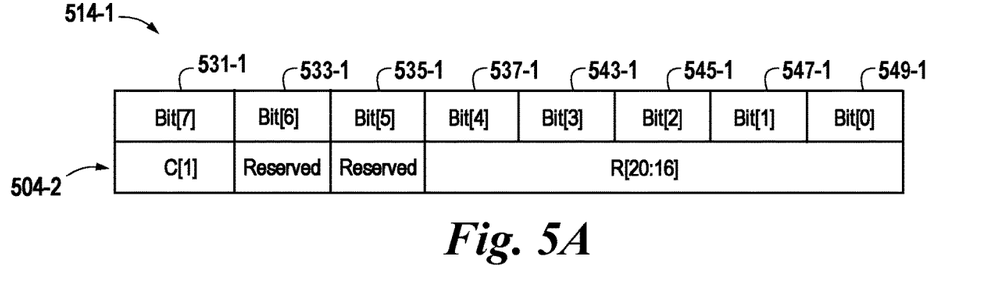
FIGS. 5A-5C are each an example portion of a mode register of a memory device associated with row addresses in accordance with a number of embodiments of the present disclosure.

FIGS. 5A-5C are each an example portion of a mode register 514-1, 514-2, 514-3 of a memory device associated with row addresses in accordance with a number of embodiments of the present disclosure. As illustrated in FIG. 5A, a portion of a mode register 514-1 can include a row of flip-flops 504-2. A seventh bit ("Bit[7]") 531-1 can be a column bit ("C[1]") used to indicate which column in the particular bank (addressed in the portion of mode register 414) that the memory cells are located for disabling the flip on precharge operation. A sixth ("Bit[6]") 533-1 and fifth ("Bit[5]") 535-1 can be reserved for future use. A fourth bit ("Bit[4]") through a zeroth bit ("Bit[0]") 549-2 can be used to store an address location for rows 20 through 16 (e.g., "R[20:16]").

Figure 5B:
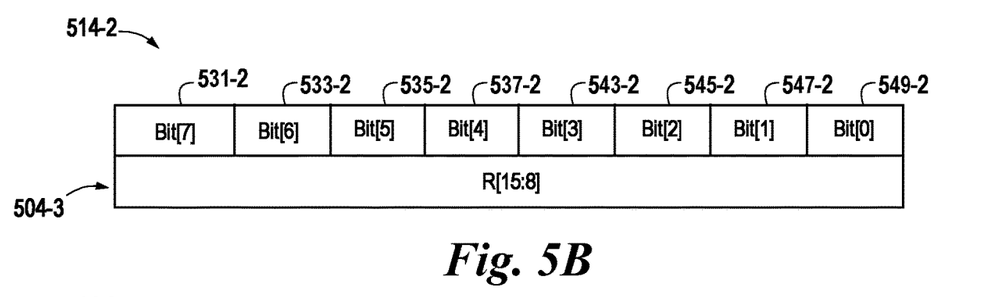
Figure 5C:
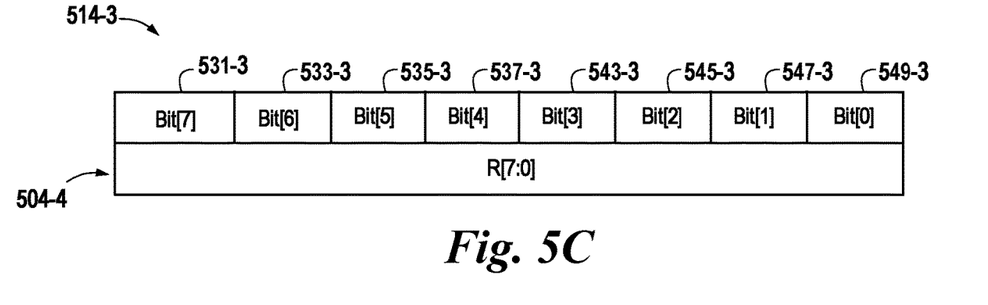

As illustrated in FIG. 5B, a portion of a mode register 514-2 can include a row of flip-flops 504-3. A seventh bit ("Bit[7]") 531-2 through a zeroth bit ("Bit[0]") 549-2 can be used to store an address location for rows 8 through 15 (e.g., "R[15:8]"). As illustrated in FIG. 5C, a portion of a mode register 514-3 can include a row of memory cells 504-4. A seventh bit ("Bit[7]") 531-3 through a zeroth bit ("Bit[0]" 549-3 can be used to store an address location for rows 8 through 15 (e.g., "R[7:0]").

Figure 6A:
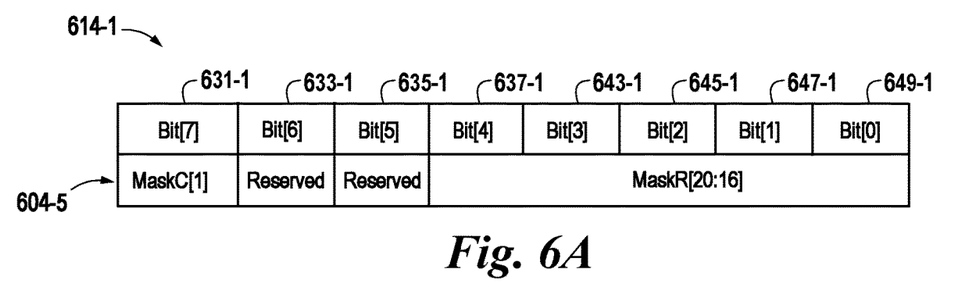
FIGS. 6A-6C are each an example portion of a mode register of a memory array associated with masked row addresses in accordance with a number of embodiments of the present disclosure.
Figure 6B:
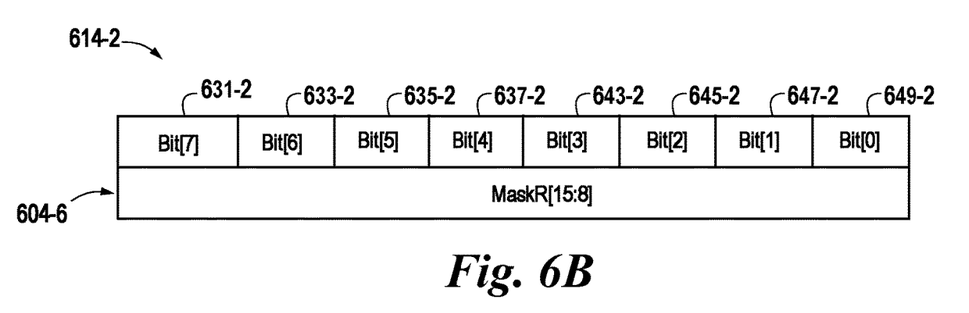
Figure 6C:
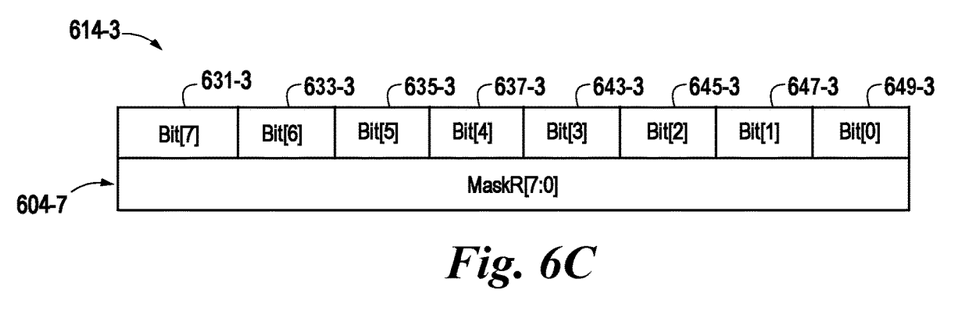

FIGS. 6A-6C are each an example portion of a mode register 614-1, 614-2, 614-3 of a memory array associated with masked row addresses in accordance with a number of embodiments of the present disclosure. As illustrated in FIG. 6A, a portion of a mode register 614-1 can include a row of flip-flops 604-5. A seventh bit ("Bit[7]") 631-1 can be a column mask bit ("MaskC[1]") used to indicate which column in the particular bank (addressed in the portion of mode register 414) that the memory cells are located for disabling the flip on precharge operation. A sixth ("Bit[6]") 633-1 and fifth ("Bit[5]") 635-1 bit can each be reserved for future use. A fourth bit ("Bit[4]") 637-1 through a zeroth bit ("Bit[0]") 649-1 can be used to mask stored address locations for rows 20 through 16 (e.g., "MaskR[20:16]"). As an example, a bit of "1" stored in the mask can indicate to use either a "1" or a "0" in the mode register to indicate to disable the flip on precharge operation on those particular address locations, as will be described further in association with FIG. 6C below.

As illustrated in FIG. 6B, a portion of a mode register 614-2 can include a row of flip-flops 604-6. A seventh bit ("Bit[7]") 631-2 through a zeroth ("Bit[0]") 649-2 can be used to store an address location for rows 8 through 15 bit (e.g., "MaskR[15:8]"). As illustrated in FIG. 6C, a portion of a mode register 614-3 can include a row of flip-flops 604-7. A seventh bit ("Bit[7]") 631-3 through a zeroth bit ("Bit[0]" 649-3 can be used to store an address location for rows 8 through 15 (e.g., "MaskR[7:0]").

As an example and in order to further describe how the mask bits operate, a first example of how bank address bits (e.g., bits "BA[5:0]" in FIG. 4), row address bits (e.g., bits "R[20:16]," "R[15:8]," and "R[7,0]" in respective FIGS. 5A-5C), and column address bits (e.g., "C[1]" in FIG. 5A) stored in the mode register (e.g., mode registers 414 in FIGS. 4 and 514-1, 514-2, 514-3 in respective FIGS. 5A-5C) is illustrated in Table 1 below.

TABLE 1

Example 1
Bank = 3, Row = 4, Column = 0

| Description | Symbol | Disable FoP Address | Disable FoP Mask |
|---|---|---|---|
| Bank Address Bits | BA[5:0] | 3 | — |
| Row Address Bits | R[20:0] | 4 | 0 . . . 0b |
| Column Address Bits | C[1] | 0 | 0b |

For Example 1 illustrated in Table 1, the bank address is 3, the row address is 4, and the column address is 0. There is no mask values because there is only one row value designated and one column value designated so masking is not needed.

A second example is illustrated below in Table 2. This second example shows a bank address of 3, a row address of 4, and a column address of 1. Again, no masking is needed here because there is only one row address and one column address for the disabling of the flip on precharge operation.

TABLE 2

Example 2
Bank = 3, Row = 4, Column = 1

| Description | Symbol | Disable FoP Address | Disable FoP Mask |
|---|---|---|---|
| Bank Address Bits | BA[5:0] | 3 | — |
| Row Address Bits | R[20:0] | 4 | 0 . . . 0b |
| Column Address Bits | C[1] | 1 | 0b |

A third example is illustrated below in Table 3. This third example shows a bank address of 3, a row address of 4, and a column address of 0 and 1. The column address of 0 and 1 indicates that a flip on precharge operation should be disabled for a column address of either a 0 or 1. This 0 or 1 for the column address would be indicated in the mask mode register illustrated in FIGS. 6A-6C where the column bits are stored.

TABLE 3

Example 3
Bank = 3, Row = 4, Column = 0 to 1

| Description | Symbol | Disable FoP Address | Disable FoP Mask |
|---|---|---|---|
| Bank Address Bits | BA[5:0] | 3 | — |
| Row Address Bits | R[20:0] | 4 | 0 . . . 0b |
| Column Address Bits | C[1] | 0<br>0 = 0b<br>1 = 1b | 1b |

A fourth example is illustrated below in Table 4. This fourth example shows a bank address of 3, a row address of 4 to 7, and a column address of 1. The row address of 4 to 7 indicates that a flip on precharge operation should be disabled for a row address from 4 to 7 (including a row address of 4, 5, 6, or 7). This 4 through 7 bit value for the row address would be indicated in the mask mode register illustrated in FIGS. 6A-6C where the row bits are stored.

TABLE 4

Example 4
Bank = 3, Row = 4, Column = 0 to 1

| Description | Symbol | Disable FoP Address | Disable FoP Mask |
|---|---|---|---|
| Bank Address Bits | BA[5:0] | 3 | — |
| Row Address Bits | R[20:0] | 4<br>4 = 000100b<br>5 = 000101b<br>6 = 000110b<br>7 = 000111b | 0 . . . 00011b |
| Column Address Bits | C[1] | 1 | 0b |

A fifth example is illustrated below in Table 5. This fifth example shows a bank address of 3, a row address of 12 to 15, and a column address of 8 to 9. The row address of 12 to 15 indicates that a flip on precharge operation should be disabled for a row address from 12 to 15 (including a row addresses of 12, 13, 14, or 15). This 12 to 15 bit value for the row address would be indicated in the mask mode register illustrated in FIGS. 6A-6C where the row bits are stored. The column address of 8 to 9 indicates that a flip on precharge operation should be disabled for a column address from 8 to 9 (including column addresses of 8 or 9). This 8 to 9 bit value for the column address would be indicated in the mask mode register illustrated in FIGS. 6A-6C where the row bits are stored. While a certain number of columns are described herein, examples are not so limited and any number of columns can be used.

TABLE 5

Example 5
Bank = 3, Row = 12 to 15
Column = 8 to 9

| Description | Symbol | Disable FoP Address | Disable FoP Mask |
|---|---|---|---|
| Bank Address Bits | BA[5:0] | 3 | — |
| Row Address Bits | R[15:0] | 12<br>12 = 0 . . . 001100b<br>13 = 0 . . . 001101b<br>14 = 0 . . . 001110b<br>15 = 0 . . . 001111b | 0 . . . 00011b |
| Column Address Bits | C[5:0] | 9<br>8 = 00100b<br>9 = 00101b | 00001b |

As is illustrated above in Example 5 of Table 5, the row address stored in the mode register would be 12 (e.g., [0001100]) but the mask bits of "0000011" indicate that 13 (e.g., [0001101]), 14 (e.g., [0001110]), 15 (e.g., [0001111]) would also be used for disabling the flip on precharge operation (where the underlined numbers shown for 13, 14, and 15 are the masked bits where either a "0" or a "1" would be accepted here).

Figure 7:
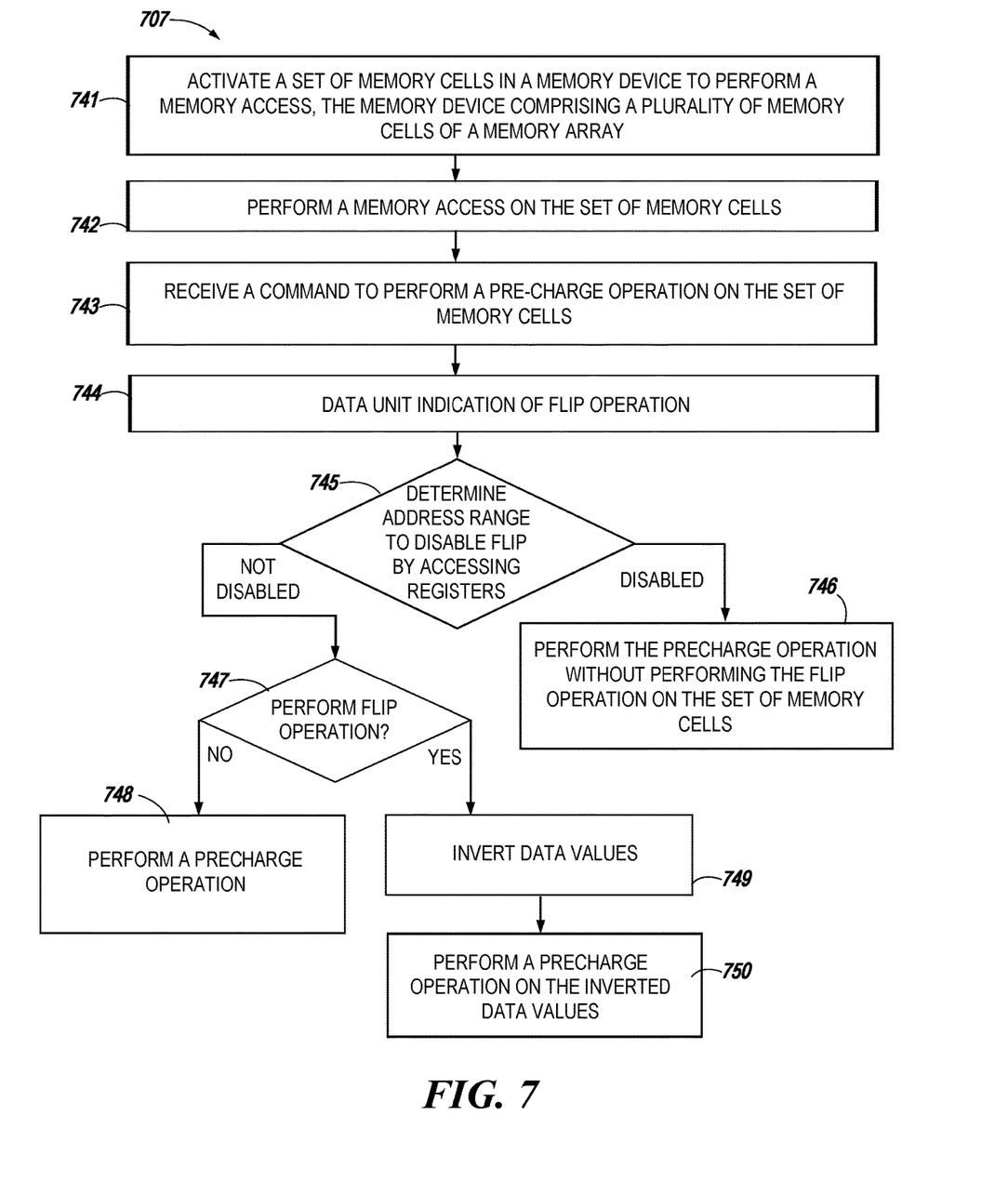
FIG. 7 illustrates a flow diagram corresponding to adjustable memory cell reliability management in accordance with a number of embodiments of the present disclosure.

FIG. 7 illustrates a flow diagram 707 corresponding to adjustable memory cell reliability management in accordance with a number of embodiments of the present disclosure. In an embodiment described in connection with FIG. 7, a computer system (e.g., the computer system 100) coupled to a host (e.g., the host 120) and including a memory controller (e.g., the controller 115), a processing device (e.g., the processing device 117), and memory devices (e.g., the first memory device 140 and the second memory device 130) can be used.

At operation 741, the flow diagram 707 includes activating a set of memory cells in a memory device to perform a memory access. The memory device can include a plurality of memory cells of a memory array, as is described in association with FIG. 1 above. A row of memory cells, any fixed number of memory cells from a row, a plurality of rows of memory cells, etc. may be activated, depending on the memory operation being performed.

At operation 742, the flow diagram 707 includes performing a memory access on the set of memory cells. The memory access can include a read operation of the memory cells and the data can be stored in a row buffer (such as row buffer 225 in FIG. 2). A row decoder and column decoder can be used to selective the particular cells or rows of cells storing the data.

At operation 743, the flow diagram 707 includes receiving a command to perform a precharge operation on the set of memory cells. The precharge operation can be an operation that closes the memory cells and prevents further access of the data stored in the memory cells. The precharge operation can be initiated at completion of the memory access or read operation described above.

At operation 744, the flow diagram 707 includes determining whether a data unit indicates to perform a random flip on precharge operation or to disable the random flip on precharge operation. At operation 745, the flow diagram 707 includes determining an address range to disable a flip on precharge operation by accessing the mode registers (e.g., mode registers 111 in FIG. 1, 414 in FIG. 4, 514-1, 514-2, 514-3 in FIGS. 5A-5C, and 614-1, 614-2, 614-3 in FIGS. 6A-6C). The mode registers that store address locations indicating which memory cell addresses to disable the flip on precharge operation on (e.g., mode registers 514-1, 514-2, 514-3 in FIGS. 5A-5C) can be accessed to determine which addresses to disable for the flip on precharge operation. Additionally, the mask mode registers (e.g., mode registers 614-1, 614-2, 614-3 in FIGS. 6A-6C) can be accessed to determine if any of the bits of the address locations are masked and whether to include a range of address (as is further described above in Examples 1-5 and illustrated in corresponding Tables 1-5 above).

At 746, in response to the FOP operation being disabled "DISABLED"), the precharge operation can be performed without performing the flip on precharge operation on the set of memory cells. At 747, the flow diagram 707 includes, in response to the data unit indicating the flip on precharge (FOP) operation has not been disabled ("NOT DISABLED" from 745 above), performing the random flip on precharge (FOP) operation (indicated by "YES") along with the precharge operation. As an example, a data unit of "0" can indicate to not disable the flip on precharge operation and the flip on precharge operation can be randomly performed along with the precharge operation. Further, a data unit of "1" can indicate to disable the flip on precharge (FOP) operation and thereby the precharge operation is performed without flipping the data.

At 748, the flow diagram 707 includes, in response to the flip on precharge operation not being selected for this precharge operation, as the flip on precharge operation is randomized and therefore is not performed when not selected randomly, performing the precharge operation on data values (stored in a buffer but subsequently stored in the memory cells after the precharge operation) without inverting the data values. At 749, the flow diagram 707 includes, in response to the flip on precharge operation being randomly selected for this particular precharge operation, inverting the data values (stored in a buffer). As an example, a pattern of data values of "0000" would be inverted to "1111," a pattern of "01010" would be inverted to "10101,"

and so forth. At 750, the flow diagram 707 includes performing a precharge operation on the inverted data values.

Figure 8:
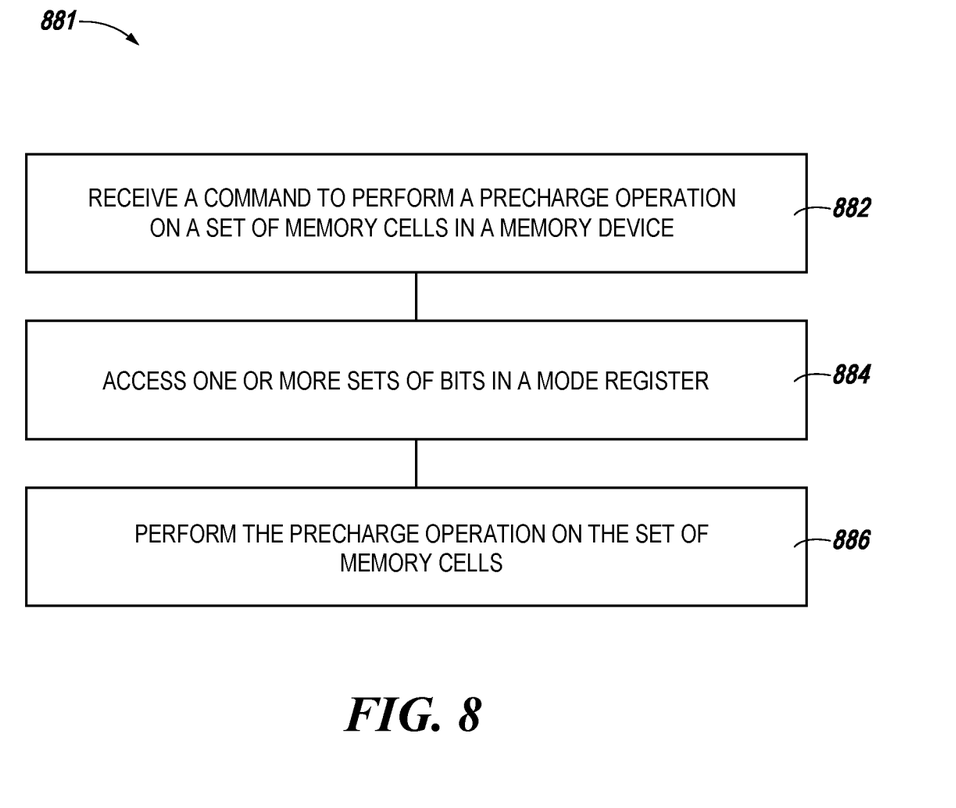
FIG. 8 illustrates a diagram representing an example method for adjustable memory cell reliability management in accordance with a number of embodiments of the present disclosure.

FIG. 8 illustrates a diagram representing an example method 881 for adjustable memory cell reliability management in accordance with a number of embodiments of the present disclosure. In some embodiments, a computer system (e.g., the computer system 100) can include a memory controller (e.g., the memory controller 115 of FIG. 1) and a processing device (e.g., the processing device 117 of FIG. 1). The memory controller can cause the processing device to disable a flip on precharge operation when performing a precharge operation on data values stored in a row of memory cells.

At 882, the method 881 describes that the memory device can receive a command to perform a precharge operation on a set of memory cells in a memory device. The memory device includes a plurality of sets of memory cells corresponding to respective portions of an array of memory cells of the memory device. The set of memory cells can correspond to a row of memory cells or a page of memory cells in the memory system. The memory controller can receive a command to perform read requests and/or write requests of a set of memory cells. The memory controller can activate a row of memory cells to access one or more memory devices. For example, the memory controller can send a command to the memory device which requests to apply a sensing voltage to a row of memory cells to activate a row of memory cells. In some examples, the memory controller can cause reading of the set of memory cells subsequent to activating the set of memory cells and prior to pre-charging the set of memory cells. In some examples, the memory system 110 can be a Compute Express Link (CXL) compliant memory device. In some further examples of the method, a read operation can be performed on the set of memory cells subsequent to activating the set of memory cells and prior to pre-charging the set of memory cells.

In some examples, the method 881 can further include, in response to the one or more first set of bits indicating to not disable the flip on precharge operation, performing the precharge operation by randomly performing the flip on precharge operation on the set of memory cells whose address locations are not in the mode register. In some examples, the address locations in the mode register indicate a number of rows of memory cells on which to disable the flip on precharge operation. In some examples, the address locations in the mode register indicate a number of columns of memory cells on which to disable the flip on precharge operation.

In some examples, the method 881 can further include performing an error correction operation, wherein performance of the error correction operation causes the one or more first set of bits to indicate to disable the flip on precharge operation. In some examples, performing the error correction operation can include writing a number of different data patterns to the set of memory cells. Performing the error correction operation can include reading a number of different data patterns from the set of memory cells.

At 884, the method 881 describes that the memory controller can access one or more sets of bits in a mode register. One or more sets of bits associated with the plurality of sets of memory cells can be accessed and can indicate whether to disable a flip on precharge operation on the set of memory cells. The one or more sets of bits in the mode register can indicate address locations of the plurality of sets of memory cells to disable the flip on precharge operation.

At 886, the method 881 describes that the memory controller can perform the precharge operation on the set of memory cells. The flip on precharge operation associated with the precharge operation can be disabled for those sets of the plurality of sets of memory cells whose address locations are in the mode register. In some examples, more than one precharge operation can be performed as more than one column is accessed. For example, if there are 64 columns in a row and all memory cells of that 64 column row should be set to a "0," the activate, write, and precharge operations can be repeatedly performed 64 times.

In some examples, the method 881 can include performing the precharge operation without randomly performing the flip on precharge operation on the set of memory cells. The precharge operation can be performed in response to the data unit indicating to disable the random flip on precharge operation. In a further example of the method 881, the precharge operation can be performed by randomly performing the flip on precharge operation on the set of memory cells. The flip on precharge operation can be randomly performed in response to the data unit indicating to not disable the flip on precharge operation. In some examples of the method, the method 881 can further include performing an error correction operation. Performance of the error correction operation can cause the data unit to indicate to disable the flip on precharge operation. Performing the error correction operation can include writing a number of different data patterns to the set of memory cells. Further, performing the error correction operation can include reading a number of different data patterns from the set of memory cells.

Although specific embodiments have been illustrated and as described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving a command to perform a precharge operation on a set of memory cells in a memory device, the memory device comprising a plurality of sets of memory cells corresponding to respective portions of an array of memory cells of the memory device;
   accessing one or more sets of bits in a mode register, wherein the one or more sets of bits in the mode register indicate address locations of the plurality of sets of memory cells to disable a flip on precharge operation; and
   performing the precharge operation on the set of memory cells, wherein the flip on precharge operation associated with the precharge operation is disabled for those sets of the plurality of sets of memory cells whose address locations are in the mode register.

2. The method of claim 1, further comprising, in response to the one or more sets of bits indicating to not disable the flip on precharge operation, performing the precharge operation by randomly performing the flip on precharge operation on the set of memory cells whose address locations are not in the mode register.

3. The method of claim 1, wherein the address locations in the mode register indicate a number of rows of memory cells on which to disable the flip on precharge operation.

4. The method of claim 1, wherein the address locations in the mode register indicate a number of columns of memory cells on which to disable the flip on precharge operation.

5. The method of claim 1, wherein the memory device is within a Compute Express Link (CXL) compliant memory device.

6. The method of claim 1, further comprising performing an error correction operation, wherein performance of the error correction operation causes the one or more sets of bits to indicate to disable the flip on precharge operation.

7. The method of claim 6, wherein the error correction operation is performed independent of whether the flip on precharge operation is enabled or disabled.

8. The method of claim 6, wherein performing the error correction operation comprises writing a number of different data patterns to the set of memory cells.

9. The method of claim 6, wherein performing the error correction operation comprises reading a number of different data patterns from the set of memory cells.

10. The method of claim 1, further comprising:
    activating a set of the plurality of sets of memory cells; and
    reading the set of memory cells subsequent to activating the set of memory cells and prior to pre-charging the set of memory cells.

11. An apparatus, comprising:
    a memory controller configured to receive a command associated with a plurality of memory cells of a memory array in a memory device; and
    a processing device coupled to the plurality of memory cells, the processing device to:
        receive a command to perform a precharge operation on a set of memory cells in the memory device, wherein the command comprises one or more data units that indicate whether to disable a flip on precharge operation on the set of memory cells;
        access one or more bits in a mode register, wherein the one or more bits indicates at least one address location of the plurality of memory cells to disable the flip on precharge operation from occurring; and
        perform the precharge operation on the set of memory cells, wherein the flip on precharge operation associated with the precharge operation is disable for memory cells associated with the address locations of the one or more bits in the mode register.

12. The apparatus of claim 11, wherein the processing device is to, prior to performing the precharge operation:

activate the set of memory cells in the memory device to perform a memory access; and perform a read operation on the set of memory cells.

13. The apparatus of claim 11, wherein the processing device is to, in response to the one or more data units indicating to not disable the flip on precharge operation, determine whether to perform the flip on precharge operation based on a randomized selection of the flip on precharge operation, wherein the one or more bits in the mode register are disregarded for the randomized selection of the flip on precharge operation.

14. The apparatus of claim 13, wherein the processing device is to, in response to determining to perform the flip on precharge operation, inverting the data values stored in the set of memory cells whose associated address locations are not stored in the mode register.

15. The apparatus of claim 13, wherein the processing device is to perform the precharge operation on the set of memory cells using the inverted data values.

16. The apparatus of claim 11, further comprising a ferroelectric field-effect transistor (FeFET) memory device, a dynamic random-access memory (DRAM), ferroelectric random-access memory (FeRAM), or a resistive random-access memory (ReRAM) device, or any combination thereof.

17. A system, comprising:
a host;
a memory device coupled to the host through a sideband channel, the memory device comprising:
    a memory array comprising a plurality of memory cells; and
    a memory controller coupled to the memory array, the memory controller to:
        activate a set of memory cells in the memory device to perform a memory access;
        perform the memory access on the set of memory cells;
        receive a command to perform a precharge operation on the set of memory cells, wherein the command comprises one or more first set of bits that indicates whether to disable a flip on precharge operation on the set of memory cells;
        access one or more second set of bits in a mode register, wherein the one or more second set of bits indicate an address location of a memory cell to disable the flip on precharge operation;
        perform the precharge operation on the set of memory cells; and
        in response to the one or more first set of bits indicating to not disable the flip on precharge operation, determine whether to perform the flip on precharge operation based on a randomized selection of the flip on precharge operation; and
        in response to the one or more first set of bits indicating to disable the flip on precharge operation, disable the flip on precharge operation for memory cells whose address locations are indicated in the one or more second set of bits.

18. The apparatus of claim 17, wherein the processing device is to:
in response to determining to perform the flip on precharge operation, invert the data values stored in the set of memory cells whose address locations are indicated in the second set of bits; and
perform the precharge operation on the set of memory cells using the inverted data values.

19. The system of claim 17, wherein:
the one or more second set of bits includes masked bits that indicate a range of address locations to disable the flip on precharge operation; and
the processing device is to perform a disable operation on the range of address locations indicated by the masked bits.

20. The system of claim 17, wherein the processing device is to perform the precharge operation independent of receiving instructions to perform the precharge operation from the host.

* * * * *